United States Patent
Zhao et al.

(10) Patent No.: US 10,020,044 B2
(45) Date of Patent: Jul. 10, 2018

(54) HIGH-DENSITY MAGNETIC MEMORY DEVICE

(71) Applicant: BEIHANG UNIVERSITY, Beijing (CN)

(72) Inventors: Weisheng Zhao, Beijing (CN); Zhaohao Wang, Beijing (CN); Mengxing Wang, Beijing (CN); Lei Zhang, Beijing (CN)

(73) Assignee: BEIHANG UNIVERSITY, BeiJing (CN)

( * ) Notice: Subject to any disclaimer, the term of this patent is extended or adjusted under 35 U.S.C. 154(b) by 0 days.

(21) Appl. No.: 15/795,223

(22) Filed: Oct. 26, 2017

(65) Prior Publication Data

US 2018/0061482 A1    Mar. 1, 2018

(30) Foreign Application Priority Data

Sep. 11, 2017 (CN) .......................... 2017 1 0812254

(51) Int. Cl.

| | |
|---|---|
| *G11C 11/15* | (2006.01) |
| *G11C 11/406* | (2006.01) |
| *G11C 11/16* | (2006.01) |
| *H01L 43/14* | (2006.01) |
| *H01L 27/22* | (2006.01) |

(52) U.S. Cl.
CPC ...... *G11C 11/40603* (2013.01); *G11C 11/161* (2013.01); *G11C 11/1673* (2013.01); *G11C 11/1675* (2013.01); *H01L 27/226* (2013.01); *H01L 43/14* (2013.01)

(58) Field of Classification Search
CPC ............ G11C 11/40603; G11C 11/161; G11C 11/1673; G11C 11/1675; H01L 27/226; H01L 43/14
See application file for complete search history.

(56) References Cited

U.S. PATENT DOCUMENTS

| | | | | |
|---|---|---|---|---|
| 6,048,739 | A * | 4/2000 | Hurst | H01L 43/12 257/E27.005 |
| 6,507,464 | B1 * | 1/2003 | Ohashi | G11B 5/3109 360/317 |
| 8,009,453 | B2 * | 8/2011 | Gaidis | B82Y 10/00 365/80 |
| 8,331,125 | B2 * | 12/2012 | DeBrosse | G11C 8/10 365/80 |

* cited by examiner

*Primary Examiner* — Pho M Luu

(57) ABSTRACT

A high-density magnetic memory device includes: a heavy metal strip or an antiferromagnet strip with a thickness of 0-20 nm, and a plurality of magnetic tunnel junctions manufactured thereon, wherein each of the magnetic tunnel junctions represents a memory bit, which from bottom to top comprises a first ferromagnetic metal with a thickness of 0-3 nm, an oxide with a thickness of 0-2 nm, a second ferromagnetic metal with a thickness of 0-3 nm, a synthetic antiferromagnetic layer with a thickness of 10-20 nm and a No. X top electrode with a thickness of 10-200 nm, wherein an X value is a serial number of the memory bit; two ends of the heavy metal strip or the antiferromagnet strip are respectively plated with a first bottom electrode and a second bottom electrode. The write operation for the memory device of the present invention is accomplished by applying unidirectional write currents.

10 Claims, 4 Drawing Sheets

HIGH-DENSITY MAGNETIC MEMORY DEVICE

CROSS REFERENCE OF RELATED APPLICATION

The present invention claims priority under 35 U.S.C. 119(a-d) to CN 201710812254.7, filed Sep. 11, 2017.

BACKGROUND OF THE PRESENT INVENTION

Field of Invention

The present invention relates to nonvolatile memory and logic technology, and more particularly to a high-density magnetic memory device.

Description of Related Arts

With the continuous scaling of the complementary metal-oxide semiconductor (CMOS), the leakage current of the transistor is increasing, and the static power consumption becomes the main source of the total energy dissipation of the conventional memory and logic circuits. Emerging non-volatile memory technology can maintain stored data when power failure happens, which is expected to solve the above static power consumption problem. Among them, magnetic random access memory (MRAM) based on magnetic tunnel junction (MTJ) has the advantages of high operation speed, good process compatibility and unlimited endurance, which is considered one of the most promising nonvolatile memories. Conventionally, the mainstream write method of MRAM is spin transfer torque (STT). However, STT-MRAM suffers from serious asymmetry between the two write directions of memory cell, which are due to source degeneration of access transistor, as well as intrinsic asymmetry of the transfer of the spin angular moment. In order to meet the performance requirements of the STT-MRAM, the size of the access transistor of the bit-cell must be sufficiently large to provide the adequate write current for the poorer write direction, but leading to excessive write current in the other write direction. As a result, large write power and high write voltage cause deterioration of memory performance.

Recently, spin orbit torque (SOT) has been proposed as a new technology for the write operation of MRAM. In order to generate the SOT, a heavy metal or antiferromagnet strip with strong spin-orbit coupling can be contacted to the free layer of the magnetic tunnel junction. The current flowing through the heavy metal or antiferromagnet strip can generate a SOT by the spin Hall effect or the Rashba effect to switch the magnetization of the adjacent free layer, thereby completing the data write of the magnetic tunnel junction. Compared with the STT, the SOT can achieve faster write speed and lower write power, and the write current does not pass through the magnetic tunnel junction, greatly reducing the risk of potential barrier breakdown. However, the SOT-MTJ is a three-terminal device, so the memory cell of the SOT-MRAM must be equipped with two access transistors, reducing the storage density. In addition, in the SOT-MRAM, the asymmetry of the write operation due to the source degeneration of the transistor is not solved.

SUMMARY OF THE PRESENT INVENTION

In view of the asymmetric write operation of the magnetic random access memory mentioned above, the low integration density, the large write power consumption, the high write voltage, etc., an object of the present invention is to provide a high-density magnetic memory device, which uses two unidirectional currents to complete data write, which solves source degeneration of an access transistor and reduces an area of a memory cell.

Accordingly, in order to accomplish the above object, the present invention provides a high-density magnetic memory device, comprising: a heavy metal strip (with a thickness of 0-20 nm) or an antiferromagnet strip (with a thickness of 0-20 nm), and a plurality of magnetic tunnel junctions manufactured thereon, wherein each of the magnetic tunnel junctions represents a memory bit, which from bottom to top comprises a first ferromagnetic metal (with a thickness of 0-3 nm), an oxide (with a thickness of 0-2 nm), a second ferromagnetic metal (with a thickness of 0-3 nm), a synthetic antiferromagnetic layer (with a thickness of 10-20 nm) and a No. X top electrode (with a thickness of 10-200 nm), wherein an X value is a serial number of the memory cell; two ends of the heavy metal strip or the antiferromagnet strip are respectively plated with a first bottom electrode and a second bottom electrode.

According to the memory device of the present invention, a substrate is plated with the layers in an order from bottom to top by using conventional molecular beam epitaxy, atomic layer deposition or magnetron sputtering, and then using conventional nano-device processing technology such as photolithography and etching.

The magnetic tunnel junctions are square-shaped, rectangular-shaped (with any length-width ratio), round-shaped or oval-shaped (with any aspect ratio).

Preferably, the heavy metal strip or the antiferromagnet strip is rectangular-shaped; a top area thereof is larger than a total bottom area of all the magnetic tunnel junctions, and bottom shapes of the magnetic tunnel junctions are entirely enclosed in a top shape of the heavy metal strip or the antiferromagnet strip.

According to the memory device of the present invention, a manufacturing process is integrated through conventional semiconductor back-end processes.

The heavy metal strip is made of Pt, Ta or W.

The antiferromagnet strip is made of an IrMn compound or a PtMn compound, and a content of each element in the compound is different or equal.

The No. X top electrode is made of Ta, Al or Cu.

The first bottom electrode is made of Ta, Al or Cu.

The second bottom electrode is made of Ta, Al or Cu.

The first ferromagnetic metal is made of a mixed metal material CoFe, CoFeB or NiFe; and a content of each element in the mixed metal material is different or equal.

The oxide is MgO or $Al_2O_3$, so as to generate a tunneling magnetoresistance effect.

The second ferromagnetic metal is made of the mixed metal material CoFe, CoFeB or NiFe; and a content of each element in the mixed metal material is different or equal.

The synthetic antiferromagnetic layer is a mixed layer of $Ta/[Co/Pt]_n/Ru/[Co/Pt]_m$, $Ta/[Co/Pd]_n/Ru/[Co/Pd]_m$, Ru/CoFe/PtMn, Ru/CoFeB/PtMn, Ru/CoFe/IrMn or Ru/CoFeB/IrMn; a content of each element in the mixed layer is different or equal, and a m value and an n value are different or equal.

According to the memory device of the present invention, stored data are represented by resistance values of the magnetic tunnel junctions.

A write method for the memory device of the present invention comprises two steps of: 1) writing all magnetic tunnel junctions to a high resistance state; and 2) writing a part or all of the magnetic tunnel junctions to a low resistance state according to data to be stored; wherein the step 1) is achieved by applying a unidirectional current between a first bottom electrode and a second bottom electrode, and the step 2) is achieved by applying the unidirectional current between the first bottom electrode and a No. X top electrode, or between the second bottom electrode and the No. X top electrode.

The present invention provides a high-density magnetic memory device, having the following advantages over a standard spin transfer torque magnetic memory and a spin orbit torque magnetic memory based on bi-directional write currents.

The present invention uses the unidirectional current for writing data, so as to solve the source degeneration problem of the access transistor in the memory cell. The transistor size can be designed according to the requirement of the better case of two writing directions, which is conducive to reducing the bit-cell area as well as the write power and the write voltage.

In the present invention, a plurality of the magnetic tunnel junctions are fabricated on the same heavy metal strip or antiferromagnet strip, and an amount of the access transistor is reduced in comparison with the spin orbit torque magnetic memory using a three-terminal magnetic tunnel junction, which is conducive to improving integration density;

In the present invention, the unidirectional write current is applied in the magnetic tunnel junctions, and a direction of a read current can be set to be opposite to the write current, thereby reducing read disturbance.

These and other objectives, features, and advantages of the present invention will become apparent from the following detailed description, the accompanying drawings, and the appended claims.

BRIEF DESCRIPTION OF THE DRAWINGS

FIG. 1-2 is a structure view of the high-density magnetic memory device according to a preferred embodiment of the present invention (round-shaped magnetic tunnel junctions).

FIG. 2 is a sketch view of a write method of the high-density magnetic memory device.

FIG. 3-1 is a sketch view of a write operation of the high-density magnetic memory device according to the preferred embodiment of the present invention.

FIG. 3-2 is a sketch view of a storage mode of the high-density magnetic memory device according to the preferred embodiment of the present invention.

Figure 1:
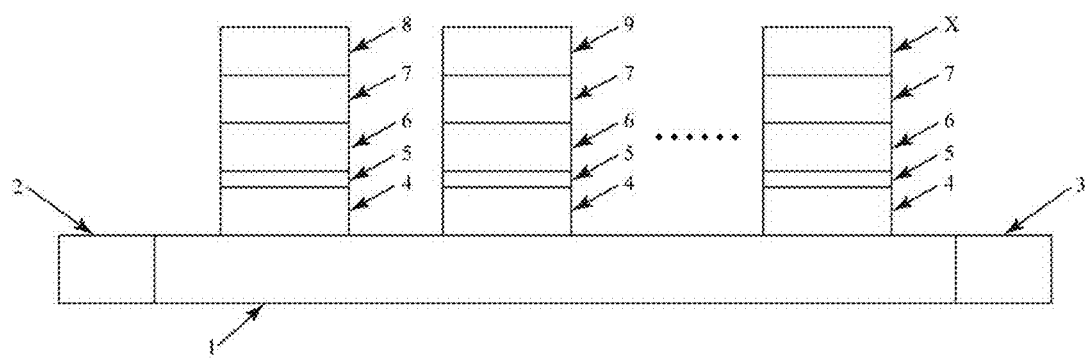
FIG. 1-1 is a structure view of a high-density magnetic memory device of the present invention.

Element reference: 1—heavy metal strip or antiferromagnet strip; 2—first bottom electrode; 3—second bottom electrode; 4—first ferromagnetic metal; 5—oxide; 6—second ferromagnetic metal; 7—synthetic antiferromagnetic layer; 8—first top electrode; 9—second top electrode; X—No. X top electrode; W1—write path between first bottom electrode and second bottom electrode; W2—write path between first bottom electrode and second top electrode; W3—write path between second bottom electrode and second top electrode; $I_1$—write current between first bottom electrode and second bottom electrode; $I_2$—write current between first bottom electrode and second top electrode; $I_3$—write current between first bottom electrode and first top electrode; B1—first magnetic tunnel junction; B2—second magnetic tunnel junction; BX—No. X magnetic tunnel junction; $R_{B1}$—resistance of first magnetic tunnel junction; $R_{B2}$—resistance of second magnetic tunnel junction; $R_{BX}$—resistance of No. X magnetic tunnel junction; t-time; $R_H$—maximum resistance of magnetic tunnel junction; $R_L$—minimum resistance of magnetic tunnel junction; $I_{H\_L}$—write current needed for changing magnetic tunnel junction from high resistance state to low resistance state; $I_{L\_H}$—write current needed for changing magnetic tunnel junction from low resistance state to high resistance state; $D_{H\_L}$—write delay for changing magnetic tunnel junction from high resistance state to low resistance state; $D_{L\_H}$—write delay for changing magnetic tunnel junction from low resistance state to high resistance state.

DETAILED DESCRIPTION OF THE PREFERRED EMBODIMENT

The essential features of the present invention will be further described with reference to the accompanying drawings. The drawings are schematic diagrams in which the thickness of each functional layer or region involved is not an actual size, and the resistance and current values in the operating mode are also not actual values.

One skilled in the art will understand that the embodiment of the present invention as shown in the drawings and described below is exemplary only and not intended to be limiting. The embodiment is shown and described for the purposes of illustrating the functional and structural principles of the present invention and is subject to change without departure from such principles. Therefore, this invention includes all modifications encompassed within the spirit and scope of the following claims.

The present invention provides a high-density magnetic memory device, which can be used not only to build magnetic random access memory, but also to design magnetic logic circuit FIG. 1-1 is a structure view of a high-density magnetic memory device of the present invention.

The high-density magnetic memory device of the present invention comprises a plurality of magnetic tunnel junctions and a heavy metal strip or an antiferromagnet strip 1 with electrodes at both ends (i.e. a first bottom electrode 2 and a second bottom electrode 3). The magnetic tunnel junctions are manufactured on the heavy metal strip or the antiferromagnet strip 1. Each of the magnetic tunnel junctions represents a memory bit, which comprises five layers of a first ferromagnetic metal 4, an oxide 5, a second ferromagnetic metal 6, a synthetic antiferromagnetic layer 7 and a top electrode 8, 9 or X; wherein by using conventional ion beam epitaxy, atomic layer deposition or magnetron sputtering, the layers of the memory device are deposited on a substrate in an order from bottom to top, and then are processed with lithography, etching and other conventional nano-device processing technologies to prepare the memory device. A structure of the memory device is formed by the magnetic tunnel junctions stacked on the strip. Two ends of the heavy metal strip or the antiferromagnet strip 1 are respectively plated with the first bottom electrode 2 and the second bottom electrode 3, wherein the five layers of materials on the heavy metal strip or the antiferromagnet strip 1 form the magnetic tunnel junctions.

Figures 1, 2:
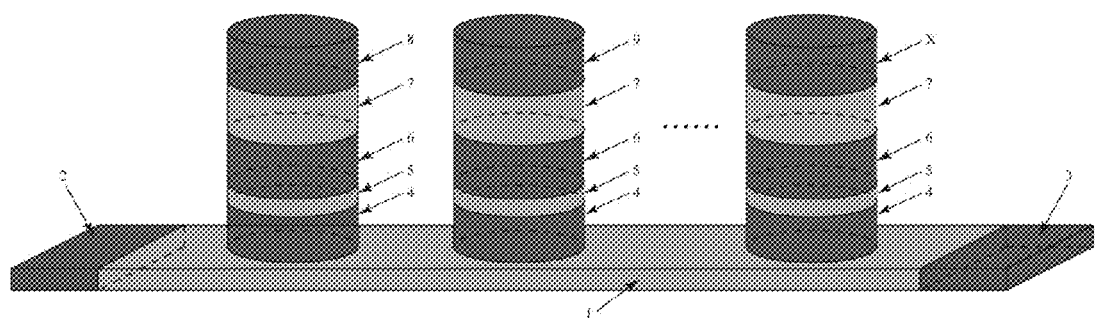
Figure 2:
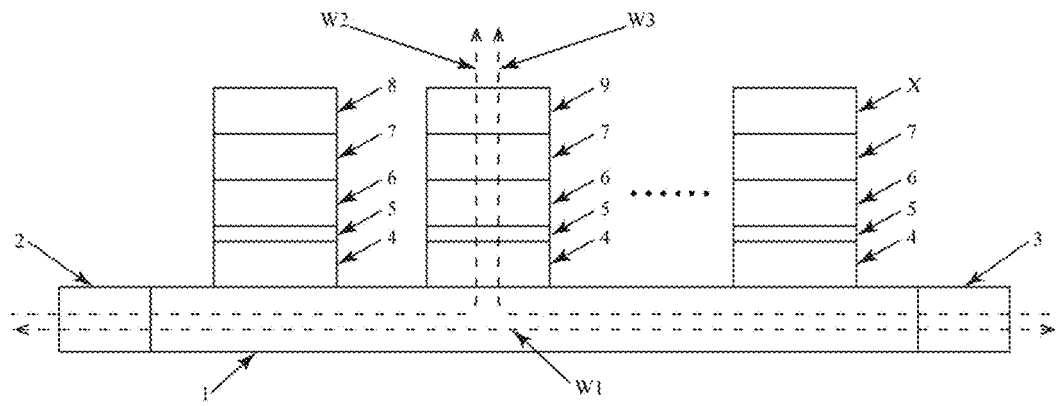

FIG. 1-2 is a structure view of the high-density magnetic memory device according to a preferred embodiment of the present invention.

Accordingly, the magnetic tunnel junctions are round-shaped, which may also be square-shaped, rectangular-shaped (with any length-width ratio) or oval-shaped (with any aspect ratio). The heavy metal strip or the antiferromagnet strip 1 is rectangular-shaped; a top area thereof is larger than a total bottom area of all the magnetic tunnel junctions, and bottom shapes of the magnetic tunnel junctions are entirely enclosed in a top shape of the heavy metal strip or the antiferromagnet strip 1.

The heavy metal strip is made of Pt, Ta or W.

The antiferromagnet strip is made of an IrMn compound or a PtMn compound, and a content of each element in the compound is different or equal.

The No. X top electrode X is made of Ta, Al or Cu.

The first bottom electrode 2 is made of Ta, Al or Cu.

The second bottom electrode 3 is made of Ta, Al or Cu.

The first ferromagnetic metal 4 is made of a mixed metal material CoFe, CoFeB or NiFe; and a content of each element in the mixed metal material is different or equal.

The oxide 5 is MgO or $Al_2O_3$, so as to generate a tunneling magnetoresistance effect.

The second ferromagnetic metal 6 is made of the mixed metal material CoFe, CoFeB or NiFe; and a content of each element in the mixed metal material is different or equal.

The synthetic antiferromagnetic layer 7 is a mixed layer of $Ta/[Co/Pt]_n/Ru/[Co/Pt]_m$, $Ta/[Co/Pd]_n/Ru/[Co/Pd]_m$, Ru/CoFe/PtMn, Ru/CoFeB/PtMn, Ru/CoFe/IrMn or Ru/CoFeB/IrMn; a content of each element in the mixed layer is different or equal, and a m value and an n value are different or equal.

FIG. 2 is a sketch view of a write method of the high-density magnetic memory device.

The write method comprises two steps of: 1) writing all magnetic tunnel junctions to a high resistance state; and 2) writing a part or all of the magnetic tunnel junctions to a low resistance state according to data to be stored. The two steps are achieved by applying currents to two different paths, wherein the step 1) is achieved by applying a current to a write path W1 between a first bottom electrode and a second bottom electrode, and the step 2) is achieved by applying a current to a write path W2 between the first bottom electrode and a top electrode, or a write path W3 between the second bottom electrode and the top electrode. A current direction of the write path W1 has two options which depends on material properties. A current direction of the write path W2 or W3 is from the first ferromagnetic metal 4 to the second ferromagnetic metal 6 of each of the magnetic tunnel junctions. For a certain device, the current directions of the two write paths are certain, namely unidirectional currents.

Figures 1, 3:
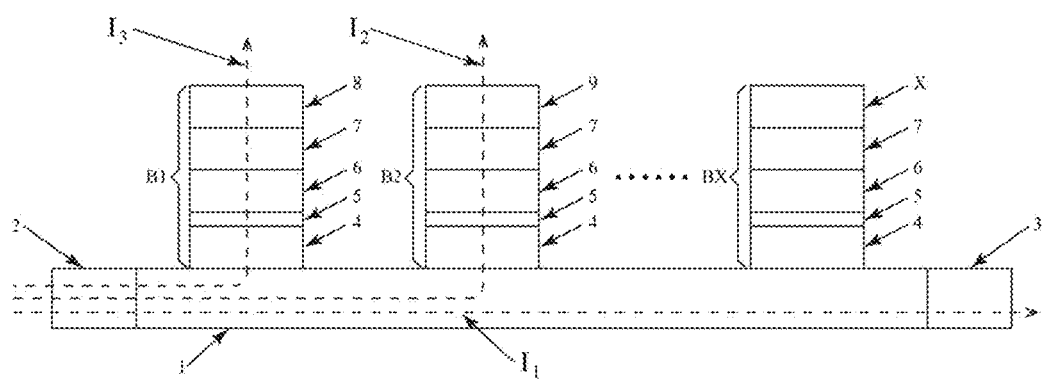
Figures 2, 3:
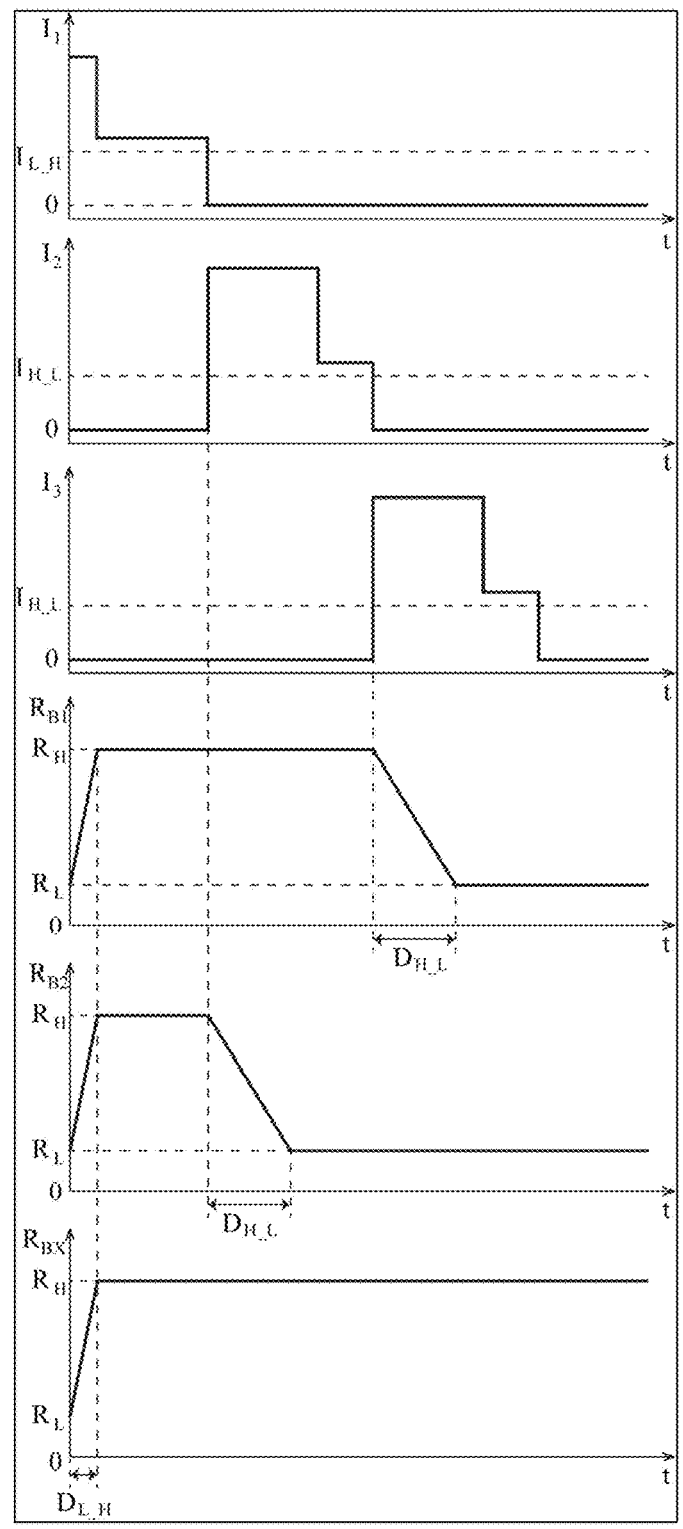

FIG. 3-1 and FIG. 3-2 are sketch views of the high-density magnetic memory device according to the preferred embodiment of the present invention, which will be further described as follows.

Accordingly, the step 1) of the write operation is firstly executed, so as to apply a unidirectional current $I_1$ with a sufficient magnitude and a sufficient duration between the first bottom electrode 2 and the second bottom electrode 3. As a result, all the magnetic tunnel junctions (including B1, B2 and BX) on the heavy metal strip or the antiferromagnet strip 1 gradually reach a maximum resistance value. At this time, the resistance value will not be changed even if a write current is decreased.

Then the step 2) is executed for stopping the unidirectional current $I_1$ between the first bottom electrode 2 and the second bottom electrode 3, and a unidirectional current $I_2$ with a sufficient magnitude and a sufficient duration is applied between the first bottom electrode 2 and the second top electrode 9. As a result, the second magnetic tunnel junction B2 gradually reaches a minimum resistance value. At this time, the resistance value will not be changed even if a write current is decreased. The same processes can be applied to other magnetic tunnel junctions, and in the preferred embodiment, a resistance value of the first magnetic tunnel junction B1 reaches a minimum value by the same operation.

What is claimed is:

1. A high-density magnetic memory device, comprising: a heavy metal strip or an antiferromagnet strip with a thickness of 0-20 nm, and a plurality of magnetic tunnel junctions manufactured thereon, wherein each of the magnetic tunnel junctions represents a memory bit, which from bottom to top comprises a first ferromagnetic metal with a thickness of 0-3 nm, an oxide with a thickness of 0-2 nm, a second ferromagnetic metal with a thickness of 0-3 nm, a synthetic antiferromagnetic layer with a thickness of 10-20 nm and a No. X top electrode with a thickness of 10-200 nm, wherein an X value is a serial number of the memory bit; two ends of the heavy metal strip or the antiferromagnet strip are respectively plated with a first bottom electrode and a second bottom electrode.

2. The high-density magnetic memory device, as recited in claim 1, wherein the magnetic tunnel junctions are square-shaped, rectangular-shaped, round-shaped or oval-shaped.

3. The high-density magnetic memory device, as recited in claim 1, wherein the heavy metal strip or the antiferromagnet strip is rectangular-shaped; a top area thereof is larger than a total bottom area of all the magnetic tunnel junctions, and bottom shapes of the magnetic tunnel junctions are entirely enclosed in a top shape of the heavy metal strip or the antiferromagnet strip.

4. The high-density magnetic memory device, as recited in claim 1, wherein the heavy metal strip is made of Pt, Ta or W.

5. The high-density magnetic memory device, as recited in claim 1, wherein the antiferromagnet strip is made of an IrMn compound or a PtMn compound, and a content of each element in the compound is different or equal.

6. The high-density magnetic memory device, as recited in claim 1, wherein the No. X top electrode is made of Ta, Al or Cu; the first bottom electrode is made of Ta, Al or Cu; and the second bottom electrode is made of Ta, Al or Cu.

7. The high-density magnetic memory device, as recited in claim 1, wherein the first ferromagnetic metal is made of a mixed metal material CoFe, CoFeB or NiFe; the second ferromagnetic metal is made of the mixed metal material CoFe, CoFeB or NiFe; and a content of each element in the mixed metal material is different or equal.

8. The high-density magnetic memory device, as recited in claim 1, wherein the oxide is MgO or $Al_2O_3$.

9. The high-density magnetic memory device, as recited in claim 1, wherein the synthetic antiferromagnetic layer is a mixed layer of $Ta/[Co/Pt]_n/Ru/[Co/Pt]_m$, $Ta/[Co/Pd]_n/Ru/[Co/Pd]_m$, Ru/CoFe/PtMn, Ru/CoFeB/PtMn, Ru/CoFe/IrMn or Ru/CoFeB/IrMn; a content of each element in the mixed layer is different or equal, and a m value and an n value are different or equal.

10. A write method for a high-density magnetic memory device as recited in claim 1, comprising two steps of: 1) writing all magnetic tunnel junctions to a high resistance state; and 2) writing a part or all of the magnetic tunnel junctions to a low resistance state according to data to be stored; wherein the step 1) is achieved by applying a unidirectional current between a first bottom electrode and a second bottom electrode, and the step 2) is achieved by applying the unidirectional current between the first bottom electrode and a No. X top electrode, or between the second bottom electrode and the No. X top electrode.

* * * * *